United States Patent [19]

Carnes

[11] 3,745,422

[45] July 10, 1973

[54] POWER SEMI-CONDUCTOR DEVICE MOUNTABLE ON EITHER ITS TOP OR BOTTOM SURFACE

[75] Inventor: Robert A. Carnes, Scottsdale, Ariz.

[73] Assignee: Motorola, Inc., Franklin Park, Ill.

[22] Filed: Mar. 7, 1972

[21] Appl. No.: 232,489

[52] U.S. Cl...... 317/234 R, 317/234 A, 317/234 G, 165/80, 29/589, 174/52

[51] Int. Cl............................. H01l 3/00, H01l 5/00

[58] Field of Search.................... 317/234, 1, 4, 4.1; 29/589; 174/52, 525, 15; 165/80

[56] References Cited

UNITED STATES PATENTS

| | | | |
|---|---|---|---|
| 2,941,688 | 6/1960 | Chamberlin et al. | 317/234 |
| 2,964,830 | 12/1960 | Henkels et al. | 317/234 |
| 3,190,952 | 6/1965 | Bitko | 317/234 |
| 3,337,678 | 8/1967 | Stelmak | 317/234 |
| 3,434,018 | 3/1969 | Boczar et al. | 317/234 |

FOREIGN PATENTS OR APPLICATIONS

| | | | |
|---|---|---|---|
| 1,110,320 | 12/1957 | Germany | 317/234 |

*Primary Examiner*—John W. Huckert
*Assistant Examiner*—Andrew J. James
*Attorney*—Vincent Rauner, Thomas G. Devine et al.

[57] ABSTRACT

A metal package, suitable for housing power transistors and other power semiconductors is disclosed. The metal package is fabricated to transfer heat from the transistor to either a top surface or to a bottom surface enabling the mounting of the package containing the power transistor or power semiconductor to a mounting surface adjacent either the top or the bottom thereof.

4 Claims, 3 Drawing Figures

PATENTED JUL 10 1973 3,745,422

POWER SEMI-CONDUCTOR DEVICE MOUNTABLE ON EITHER ITS TOP OR BOTTOM SURFACE

BACKGROUND OF THE INVENTION

The power semiconductor of this invention is of the discrete type, as differentiated from the integrated circuit type. These power devices generate a substantial amount of heat when operated. The commercial acceptability of such devices in conventional electronic cifcuit applications to a degree is based on their ability to dissipate the generated heat at a sufficiently high rate so acceptable operating characteristics will be maintained in normal as well as under severe temperature operating conditions. Excessive heat retention has an adverse effect on the operation of power semiconductors in that it reduces the power handling ability, and this effect can destroy the semiconductor unit within the device.

A popular prior art standard package for a power semiconductor is the diamond-shaped metal base into which the semiconductor is placed and then covered with a protruding metal cap which is affixed to the base. U.S. Pat. No. 3,434,018, assigned to the assignee of this invention illustrates this prior art device.

This device is mounted ordinarily to a metal mounting frame by drilling holes through the frame to receive terminals from the semiconductor and by attaching with sheet metal screws. Electrical connections are made to the leads on the other side of the frame — a sometimes unhandy requirement. My invention enables the installation of a power semiconductor device either as described in the prior art or turned over with the terminals extending away from the mounting frame.

BRIEF SUMMARY OF THE INVENTION

A preferred embodiment of this invention is a power transistor having the standard diamond-shaped base but having a profile with a substantially flat upper surface as differentiated from the protruding circular metal can top of the prior art. An aperture at opposite ends of the diamond-shaped base accommodates fasteners such as sheet metal screws for fixing the power semiconductor to a mounting frame. Since the top surface is flat, the device may be turned over and mounted with the top surface contacting the frame and the terminals projecting away from the frame for handy electrical connection to be made. The device may also be mounted in the prior art fashion, that is, with the bottom side contacting the frame and the terminals passing through holes provided in the frame. A very important feature of this invention is the facility that the device has for conducting heat away from the semiconductor and into the frame irrespective of whether the bottom or top of the device contacts the frame.

Therefore, an object of this invention is to provide a reversible mounting, power semiconductor having a standard diamond-shaped base to provide easy replacement for prior art packages.

Another object is to provide a power package for a semiconductor that will conduct heat away from the semiconductor through contact with its bottom surface or with its top surface.

Still another object of this invention is to provide a power semiconductor device that can be mounted and wired all on one side of the mounting frame.

These and other objects will be made clear in the detailed description that follows.

DETAILED DESCRIPTION OF THE INVENTION

Figure 1:
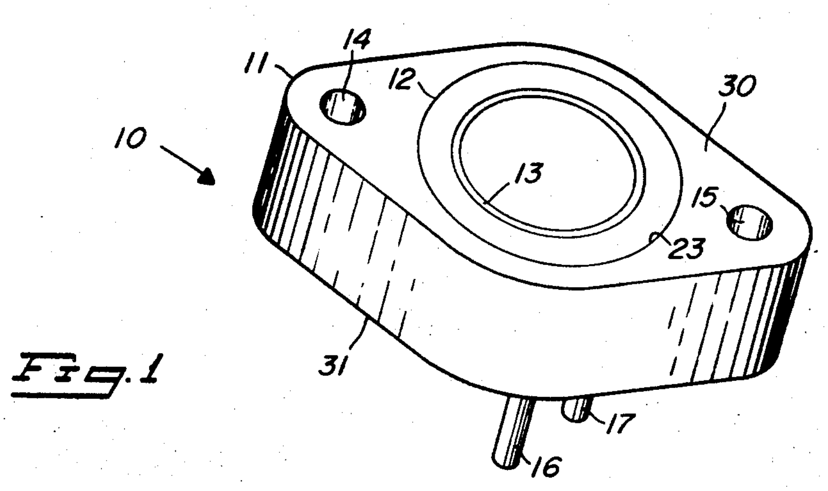
FIG. 1 is a perspective view of the device showing the top surface.

FIG. 1 illustrates the completed power semiconductor package 10 having a base 11. Base 11 has apertures 14 and 15 through which attaching screws may be passed, in either direction for affixing to a mounting frame. Base 11 also has an aperture 23 covered by cap 12. Cap 12 has an annular groove 13. Terminals 16 and 17 from the semiconductor die 19 (FIG. 3) are shown coming from the bottom surface 31 of base 11.

Figure 2:
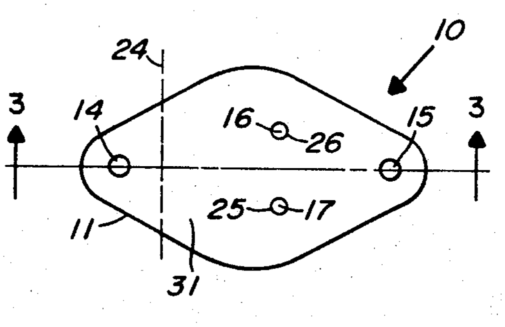
FIG. 2 is a bottom view of the base of the device.

FIG. 2 shows the bottom surface 31 of base 11. Dash line 24 illustrates that the base 11 to the left of dash line 24 may be removed if desired and simply one mounting screw through aperture 15 be used to affix the semiconductor device 10 to a mounting frame.

Figure 3:
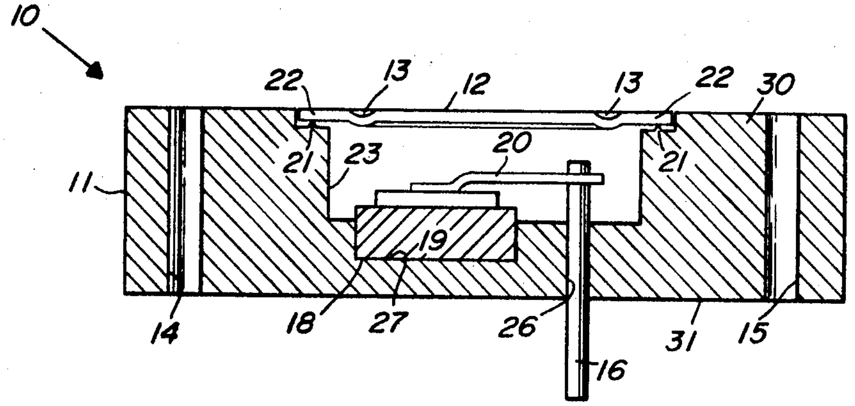
FIG. 3 is a side view and cross section.

Referring now to FIG. 3, terminal 16 is clearly shown passing through aperture 26. The base 11 has a cavity 23 to accomodate an insert 18. Clip or wire 20 connects the terminal 16 to a die 19 (the semiconductor itself) secured to insert 28. The insert 18 is of a size that fits snugly in cavity 27. The cap 12 is sealed to the base 11, with a flange 22 of the cap engaging a raised annular surface 21 of the base.

More particularly as to the base 11 of the semiconductor device 10, it may be of a diamond configuration as shown in the drawing or of another suitable configuration such as described with respect to FIG. 2.

The base 11 may be stamped from a relatively fixed strip of a metal which is heat and electrically conductive, is inexpensive, and may be readily worked when cold welding or soldering a cap 12 to it in a hermetic seal. Aluminum or an aluminum alloy preferably is used. Cavity 27, openings 14, 15, 25 and 16 and annular shoulder 21 are formed in the base simultaneously or sequentially. The cavity 23 is preferably circular in shape with a bottom and a side wall, with the depth of the cavity being such that the semiconductor die 19 and associated parts have space to be completely inserted into base 11 and still permit the connection of cap 12 to the annular shoulder 21.

The insert 18 is preferably formed of copper or copper alloy so that heat dissipates from the semiconductor die 19 at a very rapid rate. This is a preferred embodiment, but the base 11 could also be made of copper and the die 19 affixed directly to it.

After the various components such as the die 19, insert 18 and terminals 16 and 17 have been affixed to base 11, usually by soldering the cap 12 is cold-welded to the base 11 by way of lip 22 of cap 12 contacting annular shoulder 21 and pressure applied, rather than heat. Annular groove 13 is provided in cap 12 to prevent "oil canning" as a result of the cold welding process.

The semiconductor device of this invention may be readily installed on a mounting frame placing its top surface 30 directly against the mounting plate and affixing it thereto by way of sheet metal screws or the like passing through apertures 14 and 15 and into the mounting plate (not shown). In the alternative, holes can be drilled through the mounting plate for passage of terminals 16 and 17 and the semiconductor device can then be affixed to the mounting plate with its bottom surface 31 in contact with the mounting plate and, again, with sheet metal screws or the like passing through apertures 14 and 15 and affixing the semiconductor device 10 to the mounting plate.

From the above description and drawings it is apparent that the device 10 of this invention is readily interchangable with the standard configuration of the prior art and thus can be used as replacement equipment, or as new equipment with existing, pre-stamped mounting plates.

I claim:

1. A power semiconductor device having at least one terminal extending therefrom and having a metallic, heat-conductive base with a flat bottom surface and with a cavity having a side wall and lower surface, extending partially therethrough from the top surface thereof, and at least one mounting aperture completely therethrough, the improvement comprising:

a. an annular shoulder, integral with the base, recessed below the top surface of the base, directly above and surrounding the sidewall of the cavity;

b. a semiconductor die, affixed to the lower surface of the cavity; and c. a flat cap, welded to the annular shoulder, to form a relatively flat top surface, essentially parallel to the bottom surface, for selective mounting to a mounting plate with either the top surface or the bottom surface abutting the mounting plate, the mounting being accomplished by a mounting screw passing through the mounting aperture into the mounting plate.

2. The semiconductor device of claim 1 wherein the bottom surface of the cavity is recessed, the invention further comprising:

d. a metallic insert fixed within the recess, having a substantially greater thermal conductivity than the base and having the semiconductor die affixed thereto.

3. The semiconductor device of claim 2 wherein the base is aluminum or an aluminum alloy and the insert is copper or a copper alloy.

4. A semiconductor device of claim 1 wherein the base is copper or a copper alloy.

* * * * *